United States Patent [19]

Carpentier et al.

[11] Patent Number: 4,636,631

[45] Date of Patent: Jan. 13, 1987

[54] PHOTOCONDUCTING DETECTOR IN OPTICAL IMMERSION

[75] Inventors: Yves Carpentier, Savigny s/Orge; André Gauthier, Paris, both of France

[73] Assignee: Societe Anonyme de Telecommunications, France

[21] Appl. No.: 596,390

[22] Filed: Apr. 3, 1984

[30] Foreign Application Priority Data

Apr. 8, 1983 [FR] France ................................. 83 05801

[51] Int. Cl.$^4$ ............................................... H01J 3/14
[52] U.S. Cl. ..................................... 250/216; 250/338
[58] Field of Search ................... 250/211 R, 216, 338, 250/353

[56] References Cited

U.S. PATENT DOCUMENTS 2,964,636 12/1960 Cary .................................. 250/211 R Primary Examiner—Gene Wan
Attorney, Agent, or Firm—Jacobs & Jacobs

[57] ABSTRACT

The invention relates to a photoconducting detector in optical immersion, comprising a detector wafer in $Hg_{1-x}Cd_xTe$, on a quartz substrate, and a hemispherical lens in CdTe, assembled on each other by a layer of photosensitive resin whose thickness is calibrated by two shims. The detector is advantageously used for the evaluation of targets.

2 Claims, 1 Drawing Figure

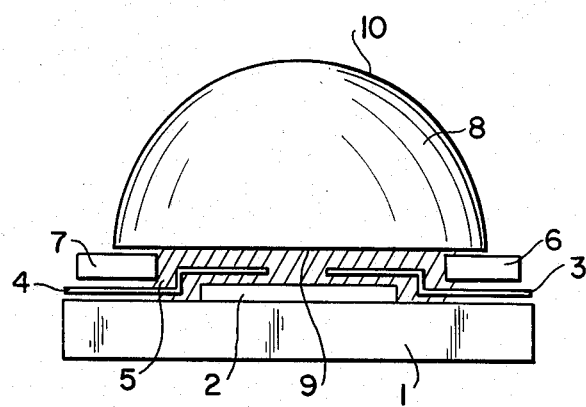

PHOTOCONDUCTING DETECTOR IN OPTICAL IMMERSION

BACKGROUND OF THE INVENTION

The present invention relates to the photoconducting detector in optical immersion, sensitive to infrared radiations, comprising a lens with convex face transparent to infrared radiations; on the side of the lens opposite its convex face a wafer of semiconducting material of one of the two types of conductivity N and P; and, between the lens and the wafer, a layer for assembling the lens and the wafer.

A detector of this type is already known, in particular by U.S. Pat. No. 2,964,636.

Such detectors are at present produced with a lens in CdTe, or Ge, and a detecting wafer in $Hg_{1-x}Cd_xTe$, which is an alloy of CdTe, a material with wide forbidden band, and of HgTe, a semi-metal material and whose wave-length of detection depends on the value of x. The detectivity of these detectors, defined by the signal-to-noise ratio and which is representative of their performances, is limited, in certain cases, by their thermal noise or their capacitive noise, without being influenced by the ambient background and its fluctuations. These infrared photodetectors not limited by the ambient background are called non-BLIPs (background limited infrared photodetectors). They are used in particular in the military field for the evaluation of targets or for telemetry.

To increase the level of the signal whilst maintaining constant that of the noise, is the same as increasing the detectivity. This is what is obtained by optical immersion, by increasing the apparent surface of the detector proper.

This apparent surface may be multiplied by $n^2$, n representing the index of the lens, if the detector is placed at the centre of a hemispherical lens, or by $n^4$, if the detector is placed at the first Weierstrass point of a hyperhemispherical lens, extending beyond the centre of the corresponding sphere.

As to the detectivity itself, it is multiplied by n in case of hemispherical immersion and by $n^2$ in case of hyperhemispherical immersion, if it is limited only by the thermal noise, and by $n^2$ in case of hemispherical immersion and by $n^4$ in case of hyperhemispherical immersion, if it is limited only by the capacitive noise.

Finally, optical immersion makes it possible to produce detectors operating at high temperature or high electrical frequency, and presenting higher detectivities than those of the non-immersed detectors under the same conditions.

In fact, and inversely, for a determined apparent sensitive surface, the real surface and therefore the thermal noise may be decreased, i.e. the detectivity may be increased.

To produce these photodetectors, the following procedure was heretofore carried out: a detector made elsewhere was purely and simply glued on a lens, the assembling layer evoked hereinabove being a layer of glue.

However, this layer of glue presents drawbacks.

The glue is an intermediate medium of low refraction index, which limits, by total reflexion, the field of sight of the detector. Moreover, it is not easy to choose a glue which simultaneously satisfies the requirements of index, infrared radiation transmission in the spectrum in question, resistance to the thermal cycles, coefficient of heat expansion, mechanical solidity, rate of degassing, stability, chemical inertia, etc . . . .

It is therefore an object of the present invention to propose a detector of the type referred to above but not presenting the afore-mentioned drawbacks.

SUMMARY OF THE INVENTION

To this end, the detector according to the invention, of the type mentioned above, is characterized in that the assembling layer is a layer of photosensitive resin, transparent to infrared radiations and chemically inert.

Photosensitive resins are especially used as materials of masking layers in the manufacture of detectors.

One of the essential qualities of a masking layer is that the surface states of the masked layers are not degraded. Now this, to say the least, is not the case of an optical glue.

In a preferred embodiment of the detector of the invention, the photosensitive resin of the assembling layer is the resin marketed by Kodak under the trademark MICRORESIST 747.

This resin, of index 1.5, is transparent in the spectral band 1–15 μm.

The assembly made with this resin withstands thermal cycles of from +80° C. to −196° C.

The innocuousness of this resin vis-à-vis the semiconducting material is very high.

BRIEF DESCRIPTION OF THE DRAWINGS

The invention will be more readily understood on reading the following description with reference to the accompanying drawings, in which:

The single FIGURE schematically shows the immersed detector according to the invention in section.

DETAILED DESCRIPTION OF A PREFERRED EMBODIMENT OF THE INVENTION

Referring now to the drawings, the detector shown in the FIGURE comprises a substrate 1, for example in alumina or quartz, and, glued on the substrate 1 serving as base, with a conventional glue, a detecting wafer 2 made of semiconducting material, in the present case $Hg_{1-x}Cd_xTe$.

The photoconductor detector 2 was obtained in known manner by suitably thinning a starting wafer of homogeneous material $Hg_{1-x}Cd_xTe$, of type N or P, x being chosen as a function of the wave-length to be detected, preferably between 0.2 and 0.7. In the example considered, the thickness of the final wafer 2 is about 10 μm.

The detector shown further comprises two contact strips 3, 4 in evaporated gold deposited on the wafer 2 and the substrate 1 and defining, on the wafer 2, the active surface of the detecting part proper.

Two shims 6, 7 of the same thickness are glued, with a conventional glue, on the contacts 3, 4, respectively, on either side of the wafer 2, in order to calibrate the thickness of the assembly layer which will be referred to hereinbelow, as well as the distance between the wafer 2 and the immersion lens which will also be referred to hereinbelow.

These shims are made of an insulating material, in the present case kapton; they may also be made of glass.

The detector also comprises an immersion lens 8 whose plane face 9 is placed on the shims 6, 7. This may be a hemispherical lens or a hyperhemispherical lens 10 with convex face, opposite its plane face 9, adapted to receive the infrared radiations. The lens 8 is preferably in CdTe or in Ge.

Finally, a layer 5 of MICRORESIST 747, trademark of a photoresin marketed by Kodak, ensures assembly, or bond, of the wafer 2 and of the lens 8. The thickness of layer 5, calibrated by the shims 6, 7 is, in the example in question, about 100 μm; this is a considerable thickness which makes it possible to reduce optical losses by luminous interferences.

The plane face 9 of the lens 8 is coated with an anti-dazzle layer, well known to the man skilled in the art, to limit optical losses by reflexion on this face, adapted to the length of response of the detector wafer 2 to the assembling photoresin, of refraction index 1.5. The convex face 10 is also coated with an anti-dazzle layer but adapted to air, of index 1.

Assembly of the detector, considered as a whole, which has just been described, is carried out in the following manner, taking only the steps essential for understanding the invention.

Shims 6, 7 are positioned with the aid of a profile projector and they are glued by means of a gluing tool, such equipment being well known to the man skilled in the art. The photoresin having been cast between shims 6, 7 and the lens 8 having been placed on the shims, the whole is taken to a temperature of 80° C. for 30 minutes for the photoresin to polymerize.

By adopting the MICRORESIST 747 as bonding agent, photoconductors are produced which give high-performances at 160° K. (−113° C.) in the 8–12 μm spectral band and at ambient temperature 293° K. (20° C.) in the 3–5 μm band, as illustrated in the following Table:

| $B_s$ | 3–5 μm | 8–12 μm |
|---|---|---|
| $\theta$ | 293° K. | 160° K. |
| $D^*$ non-immersed | $8 \cdot 10^9$ | $2 \cdot 10^9$ |

-continued

| $B_s$ | 3–5 μm | 8–12 μm |
|---|---|---|
| $\theta$ | 293° K. | 160° K. |
| $D^*$ immersed | $2 \cdot 10^{10}$ | $8 \cdot 10^9$ | in which $B_s$ represents the spectral band in μm represents the temperature in °K.

$D^*$ represents the inverse of the noise equivalent power (NEP), asterisk, well known to the man skilled in the art, expressed in $W^{-1}.cm.Hz^{\frac{1}{2}}$, W being the unit of power (watt) and Hz the unit of frequency (Hertz), given by the formula:

$$D^* = \frac{1}{NEP} \sqrt{A} \cdot \sqrt{\Delta f}$$

in which

A is the sensitive surface of the detector $\Delta f$ is the modulation frequency band.

Thanks to the invention, $D^*$ is therefore multiplied by 2.5 between 3 and 5 μm, and by 4 between 8 and 12 μm.

A photoconductor assembly with one detector has just been described; it is obvious that a mosaic of detectors may equally well be taken.

What is claimed is:

1. A photoconductive detector in optical immersion, sensitive to infrared radiation, comprising a lens, the front surface of which is convex and transparent to infrared radiation, a wafer of semi-conductor material of one of the two types of conductivity N and P on the rear side of the lens, contacts engaging the semi-conductor wafer and, between the lens and the wafer, a layer of a bonding agent for bonding the lens and the wafer, the bonding layer being a layer of a photosensitive resin that is transparent to infrared radiation and chemically inert.

2. The detector of claim 1 wherein the photosensitive resin of the assembling layer is the resin marketed by Kodak under the trademark MICRORESIST 747.

* * * * *